US009673294B2

(12) United States Patent
Tschumakow et al.

(10) Patent No.: US 9,673,294 B2
(45) Date of Patent: Jun. 6, 2017

(54) BIPOLAR TRANSISTOR STRUCTURE AND A METHOD OF MANUFACTURING A BIPOLAR TRANSISTOR STRUCTURE

(71) Applicant: Infineon Technologies Dresden GmbH, Dresden (DE)

(72) Inventors: Dmitri Alex Tschumakow, Dresden (DE); Claus Dahl, Dresden (DE); Armin Tilke, Dresden (DE)

(73) Assignee: INFINEON TECHNOLOGIES DRESDEN GMBH, Dresden (DE)

(*) Notice: Subject to any disclaimer, the term of this patent is extended or adjusted under 35 U.S.C. 154(b) by 0 days.

(21) Appl. No.: 15/063,541

(22) Filed: Mar. 8, 2016

(65) Prior Publication Data
US 2016/0190277 A1   Jun. 30, 2016

Related U.S. Application Data

(62) Division of application No. 14/295,377, filed on Jun. 4, 2014, now Pat. No. 9,312,369.

(51) Int. Cl.
| | |
|---|---|
| *H01L 21/331* | (2006.01) |
| *H01L 29/66* | (2006.01) |
| *H01L 29/417* | (2006.01) |
| *H01L 29/423* | (2006.01) |
| *H01L 29/732* | (2006.01) |
| *H01L 29/737* | (2006.01) |
| *H01L 29/06* | (2006.01) |
| *H01L 21/02* | (2006.01) |
| *H01L 21/265* | (2006.01) |
| *H01L 21/324* | (2006.01) |
| *H01L 29/08* | (2006.01) |
| *H01L 29/10* | (2006.01) |
| *H01L 29/165* | (2006.01) |

(52) U.S. Cl.
CPC .... *H01L 29/66272* (2013.01); *H01L 21/0217* (2013.01); *H01L 21/02164* (2013.01); *H01L 21/02381* (2013.01); *H01L 21/02532* (2013.01); *H01L 21/02595* (2013.01); *H01L 21/26513* (2013.01); *H01L 21/324* (2013.01); *H01L 29/0649* (2013.01); *H01L 29/0804* (2013.01); *H01L 29/0821* (2013.01); *H01L 29/1004* (2013.01); *H01L 29/165* (2013.01); *H01L 29/41708* (2013.01); *H01L 29/42304* (2013.01); *H01L 29/66242* (2013.01); *H01L 29/66287* (2013.01); *H01L 29/732* (2013.01); *H01L 29/7371* (2013.01); *H01L 29/7378* (2013.01)

(58) Field of Classification Search
CPC ............. H01L 29/0821; H01L 29/1004; H01L 29/66272; H01L 21/8249; H01L 29/41708; H01L 21/02532; H01L 29/0804; H01L 21/02595
USPC .................................................. 438/318, 353
See application file for complete search history.

(56) References Cited

U.S. PATENT DOCUMENTS

2007/0161176 A1* 7/2007 Dahl ................ H01L 29/66242
438/230

* cited by examiner

*Primary Examiner* — Theresa T Doan
(74) *Attorney, Agent, or Firm* — Viering, Jentschura & Partner mbB

(57) ABSTRACT

According to various embodiments, a bipolar transistor structure may include: a substrate; a collector region in the substrate; a base region disposed over the collector region, an emitter region disposed over the base region; a base terminal laterally electrically contacting the base region, wherein the base terminal includes polysilicon.

18 Claims, 8 Drawing Sheets

US 9,673,294 B2

BIPOLAR TRANSISTOR STRUCTURE AND A METHOD OF MANUFACTURING A BIPOLAR TRANSISTOR STRUCTURE

CROSS-REFERENCE TO RELATED APPLICATIONS

The present application is a divisional of U.S. patent application Ser. No. 14/295,377 filed Jun. 4, 2014, the entirety of which is herein incorporated by reference.

TECHNICAL FIELD

Various embodiments relate generally to a bipolar transistor structure and a method of manufacturing a bipolar transistor structure.

BACKGROUND

In general, a bipolar junction transistor (a bipolar transistor, BJT) may be manufactured in semiconductor technology via commonly applied semiconductor processing including for example layering, patterning, doping, thermal annealing, and the like. A bipolar transistor usually includes a collector, a base, and an emitter, wherein an applied voltage between the emitter and the base may be used to control a current flow between the emitter and the collector. Bipolar transistors are conventionally classified into the npn-type and the pnp-type with an emitter-base junction and a base-collector junction, respectively. Further, a bipolar junction transistor may be configured as a heterojunction bipolar transistor (HBT), wherein the emitter-base junction and the base-collector junction include different semiconductor materials creating a so-called heterojunction. Moreover, an HBT may be manufactured in SiGe technology, as a SiGe-HBT, wherein the base of a SiGe-HBT may include a silicon/germanium alloy, e.g. the base of the SiGe-HBT may be graded to provide the emitter-base junction differing from the base-collector junction.

SUMMARY

According to various embodiments, a bipolar transistor structure may include: a substrate; a collector region in the substrate; a base region disposed over the collector region, an emitter region disposed over the base region; a base terminal laterally electrically contacting the base region, wherein the base terminal includes polysilicon.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
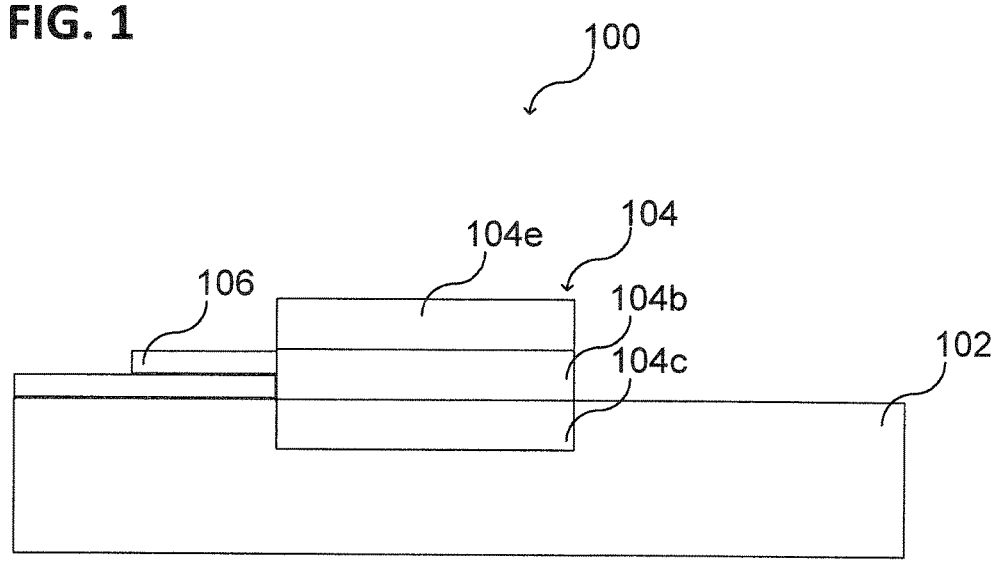
FIG. 1 shows a bipolar transistor structure in a schematic cross sectional view, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to a "lateral" extension, "laterally" next to, or "laterally" surrounding, may be used herein to mean a direction parallel to a processing surface of a substrate, a wafer, a die, or a carrier. That means that a surface of a substrate may serve as reference, commonly referred to as the main processing surface of a substrate (or the main processing surface of a wafer or the main processing surface of a die). Further, the term "width" used with regards to a "width" of a structure (e.g. of a base, of a collector, or of an emitter) may be used herein to mean the lateral extension of the structure. Further, the term "height" used with regards to a height of a structure, may be used herein to mean an extension of the structure along a direction perpendicular to the surface of a carrier (e.g. perpendicular to the main processing surface of a carrier).

Illustratively, a bipolar transistor and corresponding integration scheme (a method of manufacturing the bipolar transistor) may be provided, according to various embodiments, wherein a polysilicon electrode is provided electrically contacting a base of a vertical bipolar transistor, wherein the base may be provided laterally next to the polysilicon electrode via epitaxially growing silicon over a single crystalline collector. A polysilicon electrode for contacting the base may allow an easy and cost efficient way for manufacturing a fast switching bipolar transistor, and further, it may be easy to integrate the bipolar transistor with additional structures in complementary metal-oxide-semiconductor (CMOS) technology.

According to various embodiments, a bipolar transistor structure may be provided, which may be also referred to as bipolar junction transistor (BJT). Further, the bipolar transistor structure may be configured as heterojunction bipolar transistor (HBT). Further, a method may be provided for manufacturing the bipolar transistor structure. The bipolar transistor structure may include a BJT being integrated into a substrate, such as a wafer, a chip, or a die. The bipolar transistor structure may include a plurality of bipolar junction transistors integrated into a substrate. Further, the bipolar transistor structure may include one or more bipolar junction transistors and one or more field effect transistors (FETs) for example in metal oxide semiconductor (MOS) technology. According to various embodiments, the bipolar transistor structure may be included into a chip, the chip including at last one field effect transistor in complementary metal-oxide-semiconductor (CMOS) technology. In other words, the bipolar transistor structure described herein may be manufactured in BiCMOS (Bipolar Complementary Metal Oxide Semiconductor) technology that integrates the bipolar junction transistor technology and the CMOS transistor semiconductor technology into a single integrated circuit device. A transistor in CMOS technology generally has a low power consumption and high input impedance. A transistor in bipolar technology may enable high switching frequencies and short switching times.

According to various embodiments, a substrate may include a bipolar transistor and a field effect transistor. The base-terminal connecting the base of the bipolar transistor may be provided via depositing a polysilicon layer. The deposited polysilicon layer may at the same time provide a gate of the field effect transistor.

According to various embodiments, a bipolar transistor structure may be provided herein. The integration of an HBT may be carried out in such way that the defectivity of the base-collector junction is reduced compared to commonly applied integration schemes for HBTs. Such a reduction of the defectivity may enhance the yield during processing and may allow further performance improvement activities.

According to various embodiments, a bipolar transistor structure may be provided herein. The parasitic base-collector capacitance may be small, e.g. minimal. The base-collector capacitance may be for example reduced to the electronically active region of the HBT. Furthermore, the overall HBT topography and stack height may be reduced as compared to a conventional HBT integrating approach. The bipolar transistor structure may allow an easy and simple integration of an HBT and additional CMOS on a single die. Further, the bipolar transistor structure may allow a further node shrinking. According to various embodiments, the integration scheme for the bipolar transistor structure may be substantially self-aligned.

According to various embodiments, the integration flow of the base electrode (base terminal) and the film stack described herein may allow an inherently comfortable BiCMOS integration, for example the gate deposition and patterning of a FET or MOSFET can be combined with the deposition of the base electrode of the HBT.

Commonly applied integration schemes for an HBT may include a substrate contact oxide as distance holder for the collector-base diode integration, which may inherently increase the collector-base parasitic capacitance and the overall stack height of the HBT. In the case of crystal defect appearance in commonly applied integration schemes, the latter can directly grow and migrate into the electronically active zone of the HBT.

According to various embodiments, a bipolar transistor structure may be provided having a special geometry of the base window for deposition the base of the HBT and the corresponding process flow may alleviate the processing, e.g. the process flow may be easily combined with CMOS process. Further, the process flow in accordance with various embodiments may improve the radio frequency (RF) properties of the HBT.

According to various embodiments, a base window (emitter window) may be provided during processing the bipolar transistor structure, e.g. via forming and patterning a multilayer stack including a base electrode layer and via a lateral pull-back of the patterned base electrode layer before the base is deposited over the collector. According to various embodiments, a bipolar transistor structure may be provided including an HBT in vertical technology.

FIG. 1 schematically illustrates a bipolar transistor structure 100 in a cross sectional view, according to various embodiments. The bipolar transistor structure 100 may include a substrate 102. According to various embodiments, the substrate 102 may be a silicon wafer, a silicon die, or a silicon chip. Alternatively, the substrate 102 may include a least a silicon surface layer 102, according to various embodiments.

According to various embodiments, the bipolar transistor structure 100 may include a collector region 104c provided in the substrate 102. The collector region 104c may be provided for example by locally doping the substrate 102. According to various embodiments, the bipolar transistor structure 100 may include a base region 104b, the base region 104b may be disposed over (e.g. directly on) the collector region 104c such that the base region 104b and the collector region 104c may form a base-collector junction 104b, 104c. Further, according to various embodiments, the bipolar transistor structure 100 may include an emitter region 104e, the emitter region 104e may be disposed over (e.g. directly on) the base region 104b such that the base region 104b and the emitter region 104e may form an emitter-base junction 104e, 104b.

Illustratively, the collector region 104c, the base region 104b, and the emitter region 104e provide a bipolar junction transistor 104 or, in other words, the bipolar transistor structure 100 may include a bipolar junction transistor 104 including a collector region 104c, a base region 104b, and an emitter region 104e.

According to various embodiments, the base region 104b may include single crystalline silicon, or in other words, the base region 104b may be provided by epitaxially growing silicon over the collector region 104c. In this regard, at least the active region (which may result from the geometric and electronic structure of the bipolar junction transistor 104) of the base-collector junction 104b, 104c may include single crystalline silicon to realize an optimal switching behavior of the bipolar junction transistor 104. Further, according to various embodiments, the base region 104b may include epitaxially grown silicon/germanium (SiGe) to provide a hetero junction bipolar transistor 104, wherein the base-collector junction 104b, 104c and the emitter-base junction 104e, 104b may be different from each other, e.g. they may differ in the semiconducting material providing a predefined band-gap (electronic structure) for the respective junction.

According to various embodiments, the bipolar transistor structure 100 may include a base terminal 106 (a base electrode 106) laterally electrically contacting the base region 104b, wherein the base terminal 106 may include polysilicon. According to various embodiments, the base terminal 106 may exclusively contact the base region 104b, or in other words, the bipolar transistor structure 100 may include an electrical isolation between the collector region 104c and the base terminal 106 and between the emitter region 104e and the base terminal 106, as illustrated for example in FIG. 3A.

According to various embodiments, the substrate 102 may include a plurality of BJTs 104 or HBTs 104, e.g. arranged laterally next to each other over and in the substrate 102. In this regard, respectively laterally adjacent bipolar transistor structures 100 provided over and in the substrate 102 may be electrically separated from each other via a dielectric isolation structure arranged in the substrate 102 next to the collector region 104c, the dielectric isolation structure may for example laterally surround the collector region 104c. According to various embodiments, the dielectric isolation structure may include a trench isolation structure provided in the substrate 102, e.g. a deep trench isolation (DTI) and/or a shallow trench isolation (STI).

According to various embodiments, the bipolar transistor structure 100 may include a pnp-type BJT 104 or a pnp-type HBT 104, wherein the collector region 104c and the emitter region 104e may include p-type doped silicon, and wherein the base region 104b may include n-type doped silicon or n-type doped SiGe. Alternatively, according to various embodiments, the bipolar transistor structure 100 may include an npn-type BJT 104 or an npn-type HBT 104, wherein the collector region 104c and the emitter region 104e may include n-type doped silicon, and wherein the base region 104b may include p-type doped silicon or p-type doped SiGe.

According to various embodiments, the base region 104b may be boron doped, e.g. with a doping concentration in the range from about $5*10^{18}$ At/cm$^3$ to about $2*10^{20}$ At/cm$^3$. According to various embodiments, the collector region 104c may be phosphorus doped, e.g. with a doping concentration in the range from about $5*10^{17}$ At/cm$^3$ to about $5*10^{19}$ At/cm$^3$. According to various embodiments, the emitter region 104e may be phosphorus doped, e.g. with a doping concentration in the range from about $5*10^{18}$ At/cm$^3$ to about $2*10^{21}$ At/cm$^3$.

According to various embodiments, the base terminal 106 may include polycrystalline silicon (also including so-called nano-crystalline silicon) doped with the same doping type as the base region 104b.

It goes without saying that the bipolar transistor structure 100 may be provided using other suitable semiconductor materials or material combinations, such as gallium arsenide or indium phosphide as substrate material, and aluminum gallium arsenide/gallium arsenide or indium phosphide/indium gallium arsenide as epitaxial layers over the substrate. Further, according to various embodiments, the bipolar transistor structure 100 may include gallium nitride and/or indium gallium nitride.

According to various embodiments, manufacturing the HBT 104 of the bipolar transistor structure 100 using silicon and silicon-germanium alloys (e.g. SiGe or carbon doped SiGe:C), the concentration of germanium in the base region 104b may be graded, such that a band-gap of the base-collector junction 104b, 104c is narrower than the band-gap of the emitter-base junction 104e, 104b.

According to various embodiments, adapting the band-gaps of the two junctions of the HBT 104 may increases the frequency response of the HBT 104. Further, the crystalline quality (the crystal structure) in the active regions of the BJT 104 or HBT 104 may influence the switching behavior (e.g. the frequency response) of the BJT 104 or HBT 104 of the bipolar transistor structure 100.

Figure 2:
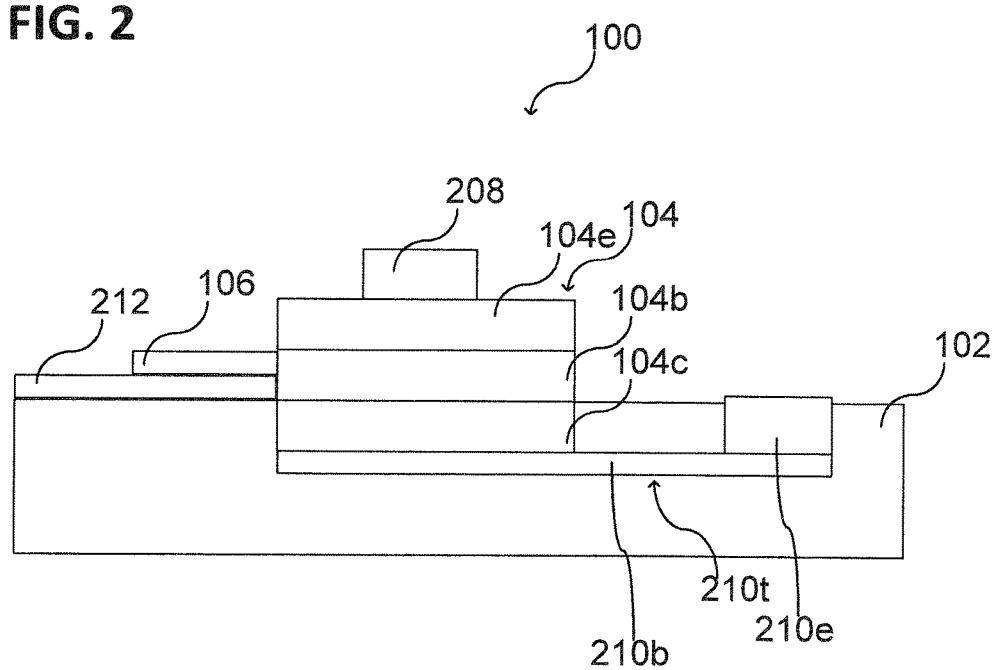
FIG. 2 shows a bipolar transistor structure in a schematic cross sectional view, according to various embodiments.

FIG. 2 illustrates the bipolar transistor structure 100 in a schematic cross sectional view, wherein the bipolar transistor structure 100 may include a dielectric layer structure 212 disposed between the substrate 102 and the base terminal 106. According to various embodiments, the dielectric layer structure 212 may include a single dielectric layer, e.g. a silicon oxide layer or a silicon nitride layer. Alternatively, the dielectric layer structure 212 may include a layer stack including for example a silicon oxide layer and a silicon nitride layer.

Further, as illustrated for example in FIG. 2, the bipolar transistor structure 100 may include a collector terminal 210t for electrically contacting the collector region 104c. According to various embodiments, the collector terminal 210t may include a buried electrically conductive layer 210b and a collector electrode 210e configured to electrically contact the collector region 104c. The electrically conductive layer 210b may be a buried electrically conductive region provided in the substrate 102.

Further, as illustrated for example in FIG. 2, the bipolar transistor structure 100 may include an emitter terminal 208 (an emitter electrode 208) for electrically contacting the emitter region 104e. According to various embodiments, the emitter terminal 208 may be disposed over (e.g. directly on) the emitter region 104e.

As illustrated in FIG. 2, the bipolar transistor structure 100 may be configured as a vertical BJT or as a vertical HBT, wherein the terminals for the collector 104c, the base 104b, and the emitter 104e may be disposed at the same side or surface of the substrate 102 (e.g. on the main processing surface of the substrate 102). Alternatively, the terminals for the base 104b and the emitter 104e may be disposed at an upper surface of the substrate 102 and the terminal for the collector 104c may be disposed at a bottom surface of the substrate 102 opposite to the upper surface.

Various modifications and/or configurations of the bipolar transistor structure 100 and details referring to the bipolar transistor regions, the terminals, and the integration into the substrate are described in the following, wherein the features and/or functionalities described with reference to FIG. 1 and FIG. 2 may be included analogously. Further, the features and/or functionalities described in the following may be included in the bipolar transistor structure 100 or may be combined with the bipolar transistor structure 100, as described before with reference to FIG. 1 and FIG. 2.

Figure 3A:
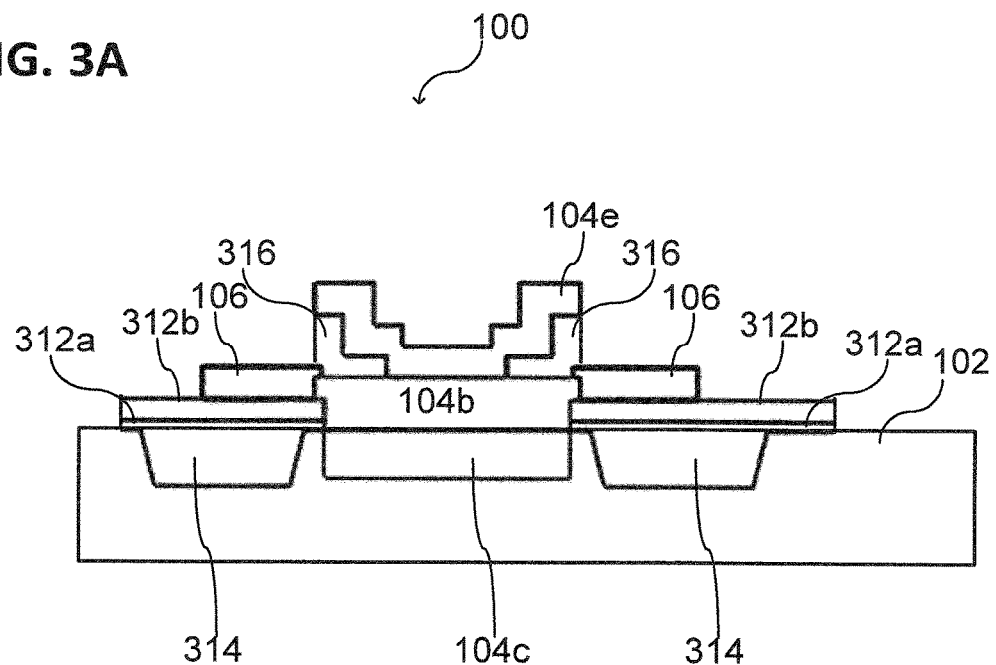
FIGS. 3A and 3B, respectively, show a bipolar transistor structure in a schematic cross sectional view, according to various embodiments.

FIG. 3A illustrates the bipolar transistor structure 100 in a schematic cross sectional view, according to various embodiments. The bipolar transistor structure 100 may include a dielectric layer structure 212 (312a, 312b) disposed between the substrate 102 and the base terminal 106. The first layer 312a of the dielectric layer structure 212 may be an oxide layer, e.g. a silicon oxide layer. The second layer 312b of the dielectric layer structure 212 may be a nitride layer, e.g. a silicon nitride layer. According to various embodiments, the dielectric layer structure 212 may include one or more dielectric layers electrically isolating the base terminal 106 from the substrate 102 and from the collector region 104c. According to various embodiments, at least the first layer 312a of the dielectric layer structure 212 may be configured as an etch stop layer with regard to silicon etching.

Further, according to various embodiments, the bipolar transistor structure 100 may include a dielectric isolation structure 314 (e.g. an STI) arranged in the substrate 102 next to the collector region 104c. The dielectric isolation structure 314 may include a trench filled with at least one dielectric material. The dielectric isolation structure 314 may electrically isolate the bipolar transistor structure 100 from adjacent electronic structures on and in the substrate 102.

Further, according to various embodiments, the bipolar transistor structure 100 may include one or more dielectric spacer structures 316 (e.g. an L-spacer structure 316) disposed over the base region 104b, e.g. disposed between the emitter region 104e and the base region 104b. The L-spacer structure 316 may define the contact region between the base region 104b and the emitter region 104e, or in other words, the L-spacer structure 316 may influence the electronic properties (e.g. the size and location of the active regions) of the BJT 104 or HBT 104 of the bipolar transistor structure 100. Further, according to various embodiments, the L-spacer structure 316 may electrically separate the emitter region 104e from the base terminal 106. According to various embodiments, the L-spacer structure 316 may include silicon nitride and/or silicon oxide.

As illustrated in FIG. 3A, the polysilicon base terminal 106 may laterally contact the base region 104b, wherein the base region 104b may include single crystalline silicon. During processing, the base terminal 106 and the base region 104b may be connected with each other via depositing silicon into the provided base window, as for example illustrated in FIG. 6A to FIG. 6K. Therefore, the polysilicon of the base terminal 106 may not grow into the base region 104b to the collector region 104c. In other words, the collector region 104c may be completely covered with epitaxially grown silicon, e.g. with single crystalline silicon, as already described before. The epitaxially grown silicon of the base region 104b may have a predefined crystallographic relationship to the single crystalline silicon of the substrate 102 in the collector region 104c.

Figure 3B:
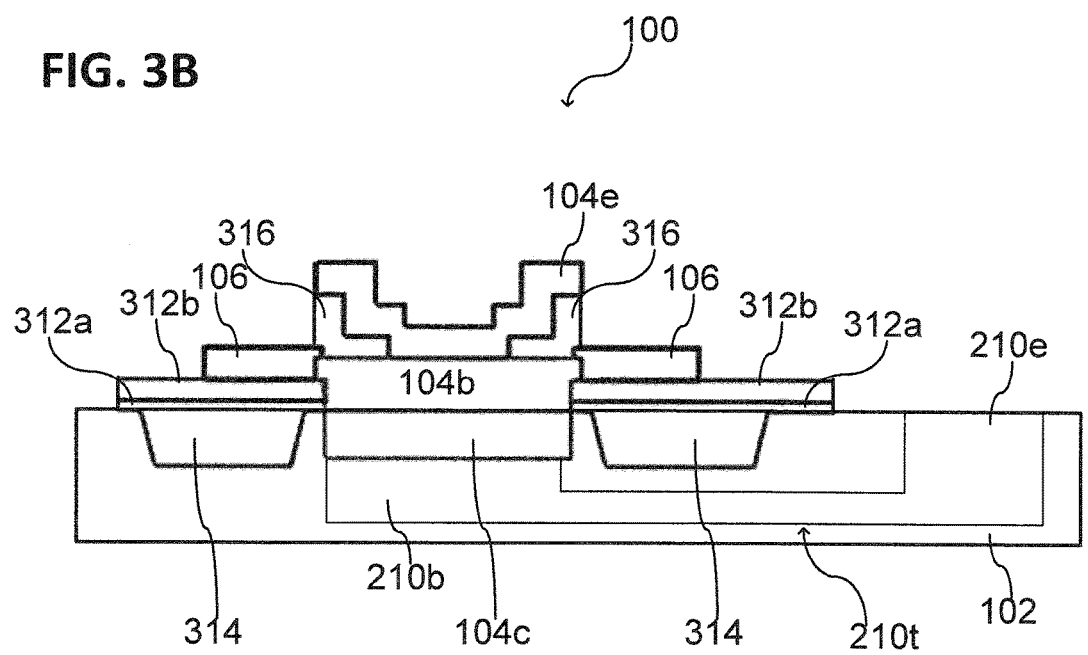

FIG. 3B illustrates the bipolar transistor structure 100, as described with reference to FIG. 3A, wherein the collector region 104c is electrically contacted via a collector terminal 210t (see e.g. FIG. 2).

According to various embodiments, the first layer 312a of the dielectric layer structure 212 and the dielectric isolation structure 314 may include the same dielectric material, e.g. silicon oxide.

According to various embodiments, the base region 104b and the collector region 104c may have substantially the same width (lateral extension), e.g. in the range from about 100 nm to about 100 μm. According to various embodiments, the base region 104b may have a height (thickness) in the range from about 10 nm to 500 nm. According to various embodiments, the collector region 104c may have a height (depth into the substrate 102) in the range from about 50 nm to about 10 μm. According to various embodiments, the emitter region 104e or the emitter layer may have a height (thickness) in the range from about 10 nm to about 500 nm. According to various embodiments, the first layer 312a of the dielectric layer structure 212 may have a thickness (height) in the range from about 1 nm to about 200 nm. According to various embodiments, the second layer 312b of the dielectric layer structure 212 may have a thickness (height) in the range from about 1 nm to about 200 nm. According to various embodiments, the base terminal 106 may have a thickness (height) in the range from about 10 nm to about 500 nm.

According to various embodiments, the base terminal 106 may laterally surround the base region 104b. According to various embodiments, the dielectric isolation structure 314 may laterally surround the collector region 104c. Illustratively, the BJT 104 or HBT 104 may be provided within a region defined by the dielectric isolation structure 314. The bipolar transistor structure 100 may further include a deep trench isolation laterally surrounding the collector region 104c and the collector terminal 210t (not shown in the figures). According to various embodiments, the collector terminal 210t may be led out (laterally) of the region defined by the dielectric isolation structure 314.

According to various embodiments, the bipolar transistor structure 100 may be included into an RF-device, e.g. into an electronic device for signal processing, signal generation, or signal transmitting, e.g. into a wireless communication device.

Figure 4:
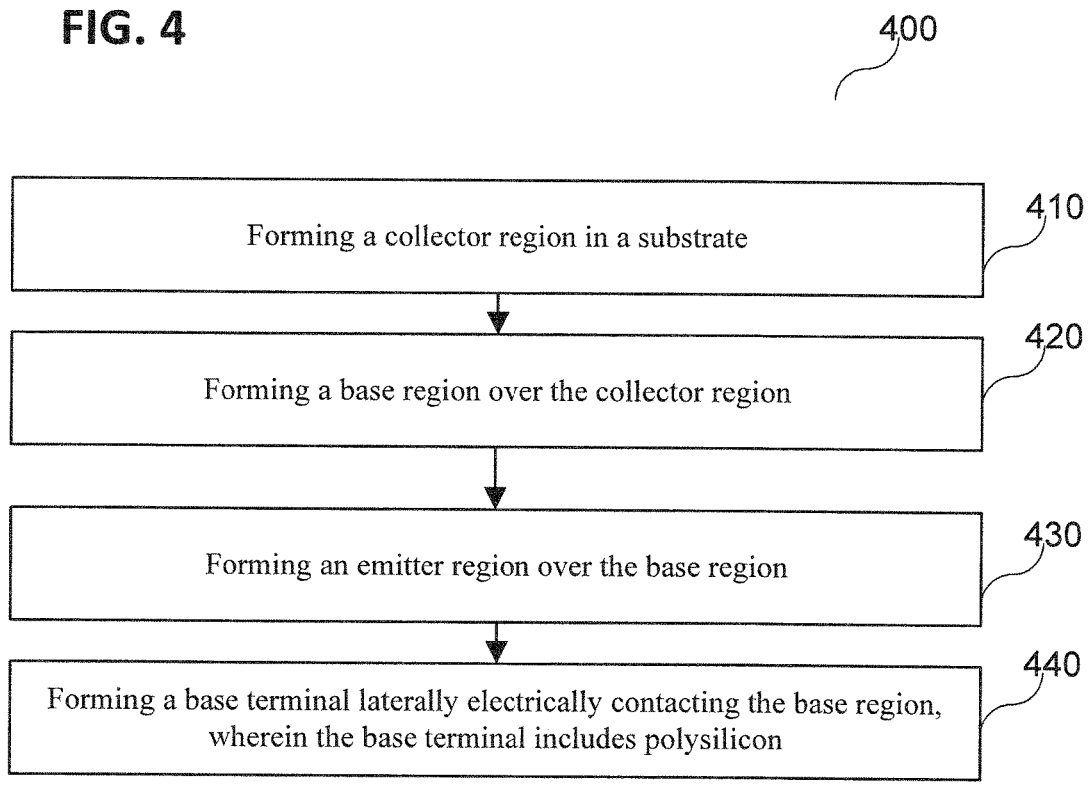
FIG. 4 shows a method of manufacturing a bipolar transistor structure in a schematic flow diagram, according to various embodiments.

FIG. 4 illustrates a method 400 of manufacturing a bipolar transistor structure 100 in a schematic flow diagram, according to various embodiments, wherein the method 400 may include: in 410, forming a collector region 104c in a substrate 102; in 420, forming a base region 104b over the collector region 104c, in 430, forming an emitter region 104e over the base region 104b; and, in 440, forming a base terminal 106 laterally electrically contacting the base region 104b, wherein the base terminal 106 may include polysilicon.

According to various embodiments, forming the base region in process 420 of method 400 may include epitaxially growing silicon from the collector region 104c, e.g. via chemical vapor deposition (CVD), the epitaxially grown silicon forming the base region 104b. According to various embodiments, during forming the base region in process 420 of method 400, the base region 104b and the base terminal 106 may grow together, wherein silicon may simultaneously grow laterally from a pre-structured base terminal layer (a polysilicon layer) into the direction of the base region 104b. Therefore, the pre-structured base terminal layer may be provided (pulled back from the base region 104b) such that the silicon laterally growing from the pre-structured base terminal layer into the direction of the base region 104b during forming the base region 104b may not affect the base region 104b. Illustratively, without a pull back of the base terminal layer from a base window for growing the base region 104e, the single crystalline growth of the base region 104b from the single crystalline collector region 104c would be disturbed by polysilicon simultaneously growing from the polycrystalline base terminal layer into the base region 104b.

Figure 5:
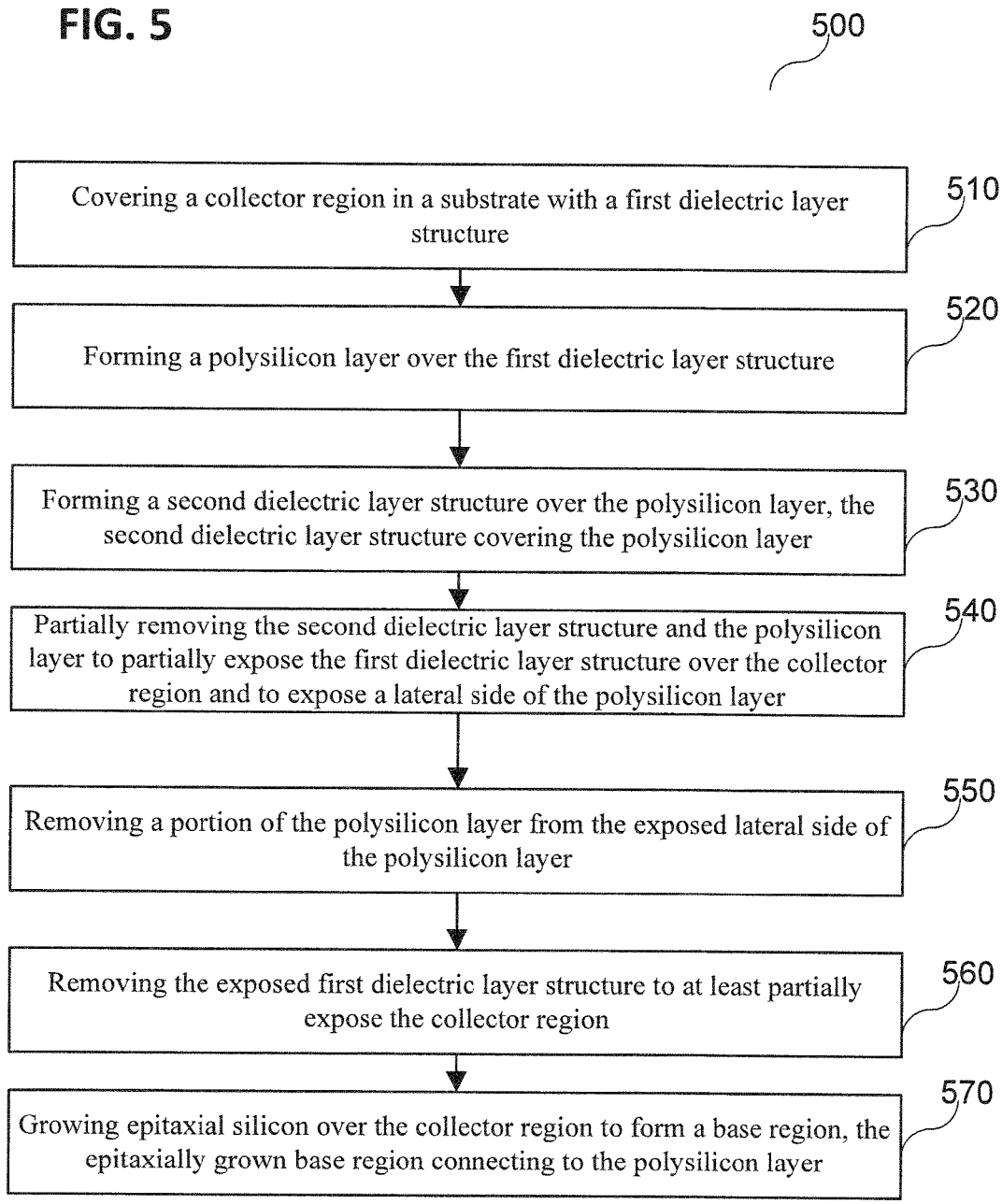
FIG. 5 shows a method of manufacturing a bipolar transistor structure in a schematic flow diagram, according to various embodiments.

FIG. 5 illustrates a method 500 of manufacturing a bipolar transistor structure 100 in a schematic flow diagram, according to various embodiments, wherein the method 500 may include: in 510, covering a collector region 104c in a substrate 102 with a first dielectric layer structure 212; in 520, forming a polysilicon layer (e.g. a base terminal layer) over the first dielectric layer structure 212, in 530, forming a second dielectric layer structure over the polysilicon layer, the second dielectric layer structure covering the polysilicon layer; in 540, partially removing the second dielectric layer structure and the polysilicon layer to partially expose the first dielectric layer structure 212 over the collector region 104c and to expose a lateral side of the polysilicon layer; in 550, removing a portion of the polysilicon layer from the exposed lateral side of the polysilicon layer (pull back the polysilicon layer); in 560, removing the exposed first dielectric layer structure 212 to at least partially expose the collector region 104c; and, in 570, growing epitaxial silicon over the collector region 104c to form a base region 104b, the epitaxially grown base region 104b connecting to the polysilicon layer 106.

According to various embodiments, growing epitaxial silicon over the collector region 104c may include growing epitaxial silicon/germanium over the collector region 104c.

According to various embodiments, method 400 and/or method 500 may be performed and/or modified to manufacture a bipolar transistor structure 100, as described herein. The method 500 may for example further include forming an emitter layer 104e over the epitaxially grown base region 104b. The method 500 may for example further include forming a sidewall spacer 316 at the second dielectric layer structure over the epitaxially grown base 104b region before the emitter layer 104e is formed.

According to various embodiments, covering the collector region 104c with a first dielectric layer 212 may include forming a first silicon oxide layer 312a over the substrate 102 (e.g. directly on the substrate 102) and forming a first silicon nitride layer 312b over the first silicon oxide layer 302a (e.g. directly on the first silicon oxide layer 302a).

According to various embodiments, the method 500 may further include patterning the emitter layer and the second dielectric layer structure to at least partially expose the polysilicon layer to expose the base terminal electrically contacting the base region.

According to various embodiments, the collector region 104c may be provided in the substrate 102 via applying an ion implantation, e.g. before or after partially removing the second dielectric layer structure and the polysilicon in process 540 of method 500.

According to various embodiments, the method 500 may further include forming two dielectric regions 314 in the substrate 102 next to the collector region 104c, e.g. before the collector region 104c is covered with the first dielectric layer structure 212 in process 510 of method 500.

According to various embodiments, the base region 104c and the polysilicon layer 106 (the base terminal 106) may be linked together via performing an anneal. According to various embodiments, the method 500 may further include providing a collector terminal 210t in the substrate 102 electrically contacting the collector region 104c.

FIGS. 6A to 6K respectively illustrate a schematic cross sectional view of a substrate 102 at various processing stages during the manufacture, e.g. during a manufacture of the bipolar transistor structure 100.

Figure 6A:
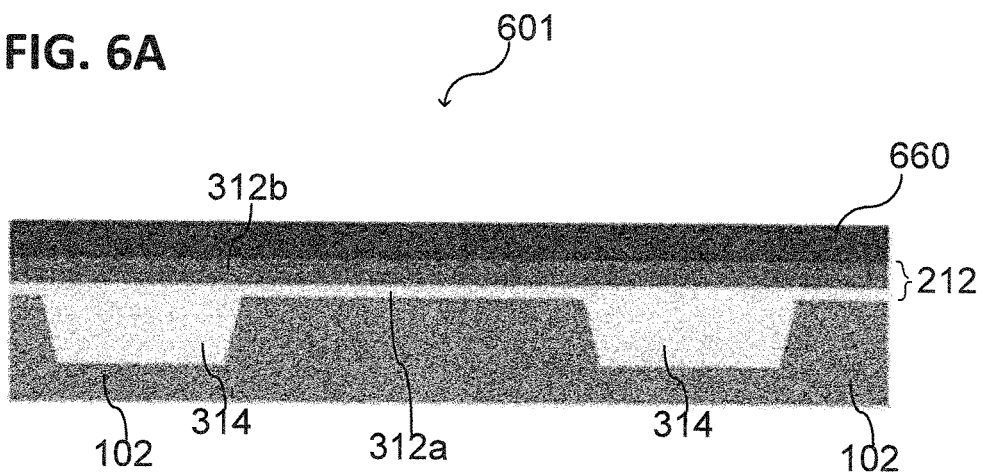
FIGS. 6A to 6K, respectively, show a bipolar transistor structure in a schematic cross sectional view at various stages during manufacture, according to various embodiments.

FIG. 6A illustrates a substrate 102 at an initial processing stage 601, wherein a layer stack is disposed over the substrate 102. The initial layer stack may include a base electrode layer 660 (a base terminal layer) and a first dielectric layer structure 212. Further, according to various embodiments, a standard shallow trench insulation module (STI) (a dielectric isolation structure 314) may be provided in the substrate 102. According to various embodiments, the base electrode layer 660 may include polycrystalline silicon, e.g. boron doped polycrystalline silicon. According to various embodiments, the STI 314 may reduce the area of the base electrode 106 (the base terminal 106) and collector 104c overlap, to decrease the capacitance between the two. According to various embodiments, the first dielectric layer structure 212 may include a silicon oxide layer 312a and a silicon nitride layer 312a. However, the first dielectric layer structure 212 may include any other suitable dielectric materials and combinations thereof. According to various embodiments, the silicon oxide layer 312a of the first dielectric layer structure 212 may be deposited or grown to have a thickness in the range from about 1 nm to about 200 nm. According to various embodiments, the silicon nitride layer 312b of the first dielectric layer structure 212 may be deposited or grown to have a thickness in the range from about 1 nm to about 200 nm. According to various embodiments, the base electrode layer 660 may be deposited or grown to have a thickness in the range from about 10 nm to about 500 nm.

According to various embodiments, the base electrode layer 660 (the polysilicon layer) may provide at least a part of the base terminal 106 of the bipolar transistor structure 100 formed during the manufacture (e.g. during method 500).

Figure 6B:
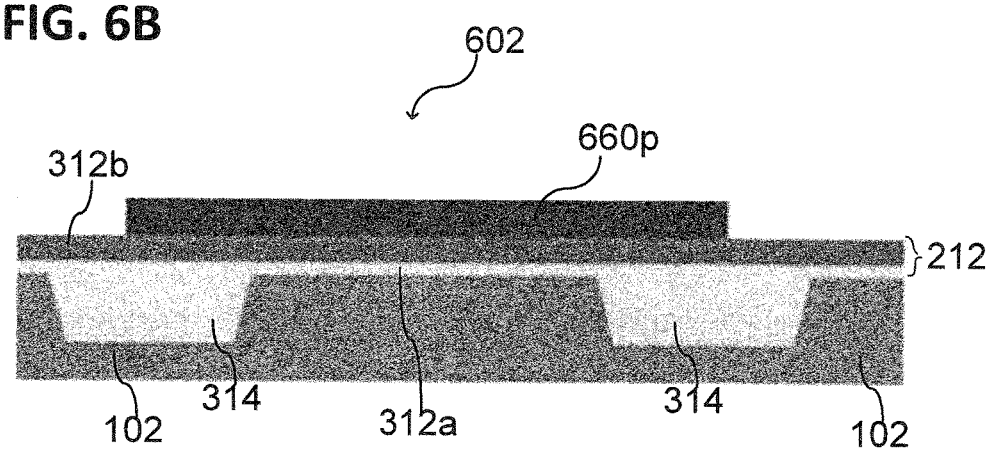

FIG. 6B illustrates the substrate 102 at a second processing stage 602, wherein the base electrode layer 660 may be patterned such that a patterned base electrode layer 660p may be provided. The patterning may include removing a portion of the base electrode layer 660 over the STI 314. Illustratively, the base electrode layer 660 may be laterally confined over the region defined by the STI 314 (e.g. in which the BJT or the HBT is to be formed).

Figure 6C:
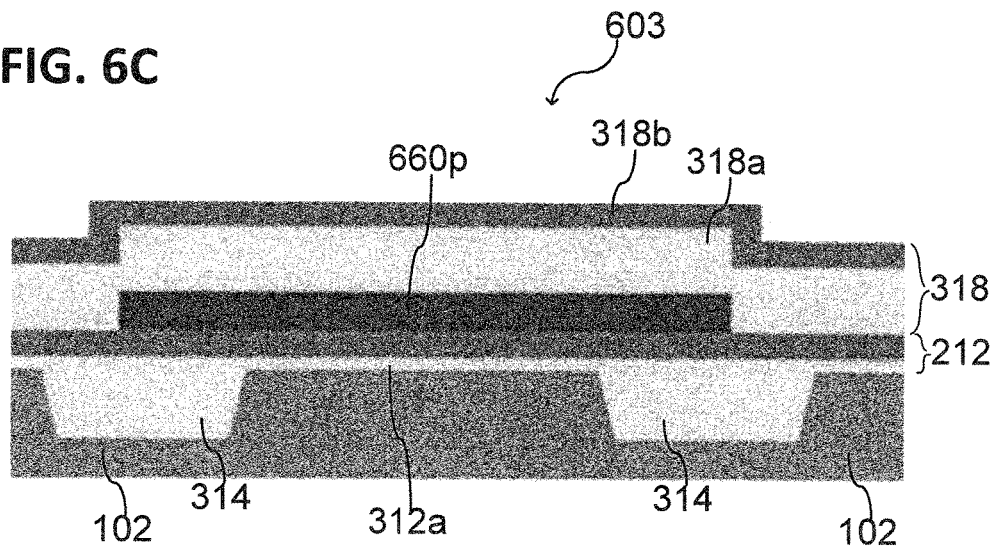

FIG. 6C illustrates the substrate 102 at a third processing stage 603, wherein an additional film stack (a second dielectric layer structure) 318 may be deposited on top of the patterned base electrode layer 660p. According to various embodiments, the second dielectric layer structure 318 may serve as distance holder between the base electrode 106 to be formed and substrate 102. According to various embodiments, the second dielectric layer structure 318 may include a silicon oxide layer 318a and a silicon nitride layer 318b. However, the second dielectric layer structure 318 may include any other suitable dielectric materials and combinations thereof.

The stack illustrated in FIG. 6C may be BICMOS process friendly. For example the bottom nitride layer 312b of the first dielectric layer structure 212 may be used as CMOS protection film. The pre-patterning of this bottom nitride layer 312b may enable the use of the same polysilicon layer 660 for CMOS gates of FETs to be provided additionally on the substrate 102.

According to various embodiments, the thickness of the layers of the first dielectric layer structure 212 and the second dielectric layer structure 318 may be configured to match a targeted thickness of the base region 104b. According to various embodiments, the silicon oxide layer 318a of the second dielectric layer structure 318 may be deposited or grown to have a thickness in the range from about 5 nm to about 500 nm. According to various embodiments, the silicon nitride layer 318b of the second dielectric layer structure 318 may be deposited or grown to have a thickness in the range from about 5 nm to about 500 nm.

According to various embodiments, the collector sink 210t (the collector terminal) and its corresponding implants and buried layers may be formed in standard semiconductor processing, which is not shown for simplicity (c.f. for example FIG. 2 and FIG. 3B).

The outer topography of the gate electrode 106 of the bipolar transistor structure 100 may be shaped via patterning the base electrode layer 660 (the polysilicon layer) by any suitable patterning method, e.g. via photo lithography (e.g. using a soft mask or a hard mask) and dry etching (e.g. reactive ion etching).

According to various embodiments, the second dielectric layer structure 318 (the emitter insulation stack) may be deposited or grown via a suitable chemical vapor deposition (CVD) or physical vapor deposition (PVD). According to various embodiments, a combination of oxide and nitride layers may be used as the second dielectric layer structure 318, which can be for example wet etched and/or dry etched independently (selectively) from each other. According to various embodiments, a combination of oxide and nitride layers may be used as the first dielectric layer structure 212, which can be for example wet etched and/or dry etched independently (selectively) from each other.

Figure 6D:
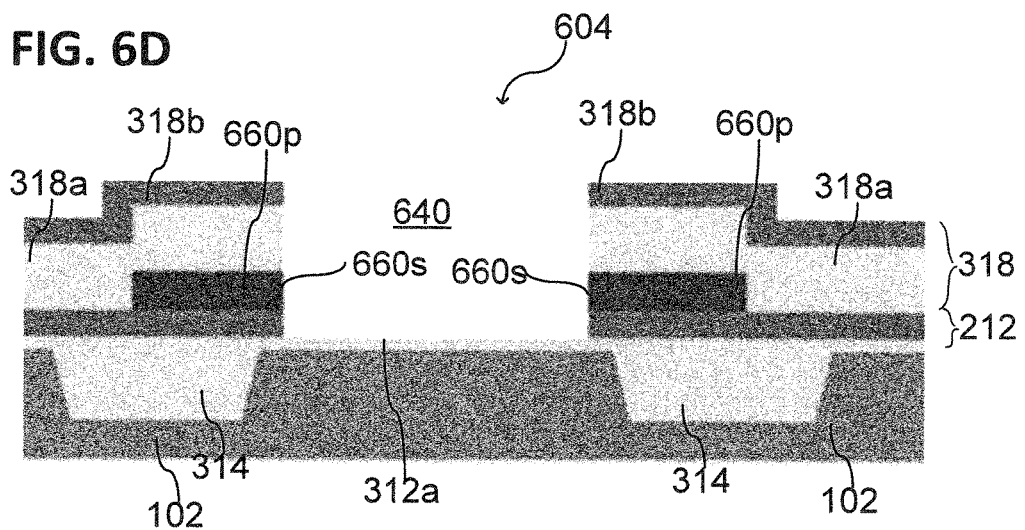

FIG. 6D illustrates the substrate 102 at a fourth processing stage 604, wherein an emitter window patterning (or base window patterning or base/emitter window patterning) has been performed, according to various embodiments. The patterning of the emitter window 640 may include photo lithography combined with a dry etching sequence, where each etching step of the dry etching sequence may have a high selectivity to the underlying layer. The etching may be stopped at the bottom oxide layer 312a. According to various embodiments, patterning the emitter window 640 may include partially removing the second dielectric layer structure 318 and the patterned polysilicon layer 660p to partially expose the first dielectric layer structure 212 over the collector region 104c and to expose a lateral side 660s of the patterned polysilicon layer 660p. According to various embodiments, patterning the emitter window 640 may include partially removing the second dielectric layer structure 318, partially removing the patterned polysilicon layer 660p, and partially removing the nitride layer 312b of the first dielectric layer structure 212 to partially expose the silicon oxide layer 312a of the first dielectric layer structure 212 over the collector region 104c and to expose a lateral side 660s of the patterned polysilicon layer 660p.

Illustratively, the emitter window 640 may partially expose the patterned polysilicon layer 660p, wherein the patterned polysilicon layer 660p may serve to form the base terminal 106 during the manufacture. According to various embodiments, as illustrated in FIG. 6D, the patterned polysilicon layer 660p and the patterned second dielectric layer structure 318 may define (laterally surround) the emitter window 640. Further, the patterned silicon nitride layer 312b of the first dielectric layer structure 212 may also define (laterally surround) the emitter window 640. The emitter window 640 may substantially have a rectangular shape seen from a top view onto the substrate 102.

Figure 6E:
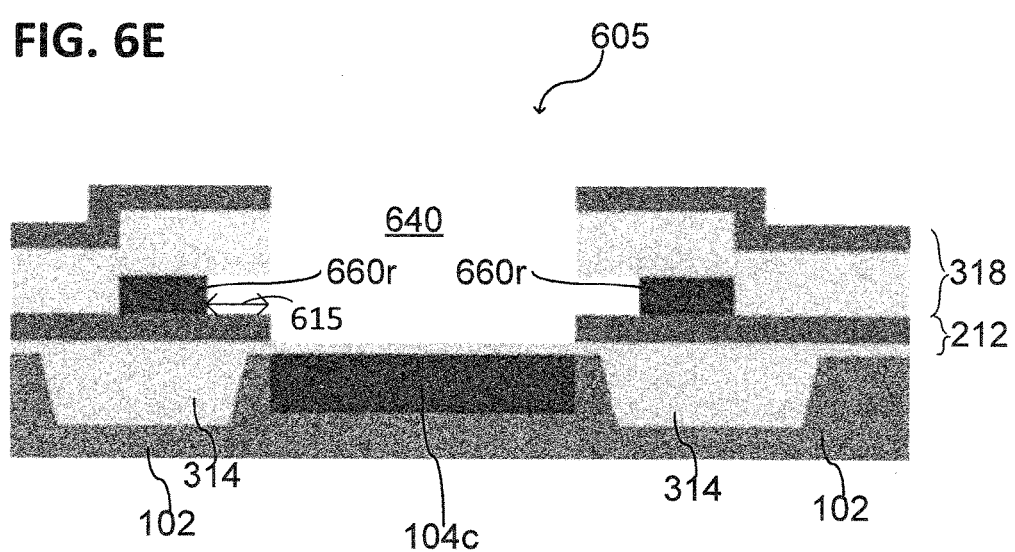

FIG. 6E illustrates the substrate 102 at a fifth processing stage 605, wherein the collector region 104c has been formed via a collector implant (via an ion implantation process). The collector region 104c may be implanted for example through the exposed silicon oxide layer 312a of the first dielectric layer structure 212.

Further, as illustrated in FIG. 6E, the polysilicon of the patterned base electrode layer 660p (the patterned polysilicon layer) may be selectively pulled back by means of selective etching, e.g. selective wet etching or selective isotropic dry etching. The length 615 of the pullback may be greater for a greater targeted thickness of the base region 104b deposition and for a greater thickness of the underlying oxide layer 312a and nitride layer 312b of the first dielectric layer structure 212. The pullback may provide space for the silicon to grow laterally from the remaining pre-structured base electrode layer 660r (a pre-structured polysilicon layer 660r) laterally toward the emitter window 640 while depositing the base region 104b over the collector region 104c such that a single crystalline growth in the base region 104b may not be disturbed by silicon growing from the pre-structured base electrode layer 660r. According to various embodiments, as illustrated in FIG. 6E a portion of the patterned polysilicon layer 660p (the patterned base electrode layer 660p) may be removed from the exposed lateral side 660s of the patterned polysilicon layer. In this regard, a pre-structured polysilicon layer 660r (a pre-structured base electrode layer 660r) may be provided to grow the base region 104b and the base terminal 106 and thereby to connect the base region 104b to the base terminal 106.

According to various embodiments, as illustrated in FIG. 6E, the process window 640 for epitaxially growing the base region 104b may have a first width and a second width greater than the first width. Illustratively, the patterned polysilicon layer 660p may be partially removed to laterally enlarge the processing window.

Figure 6F:
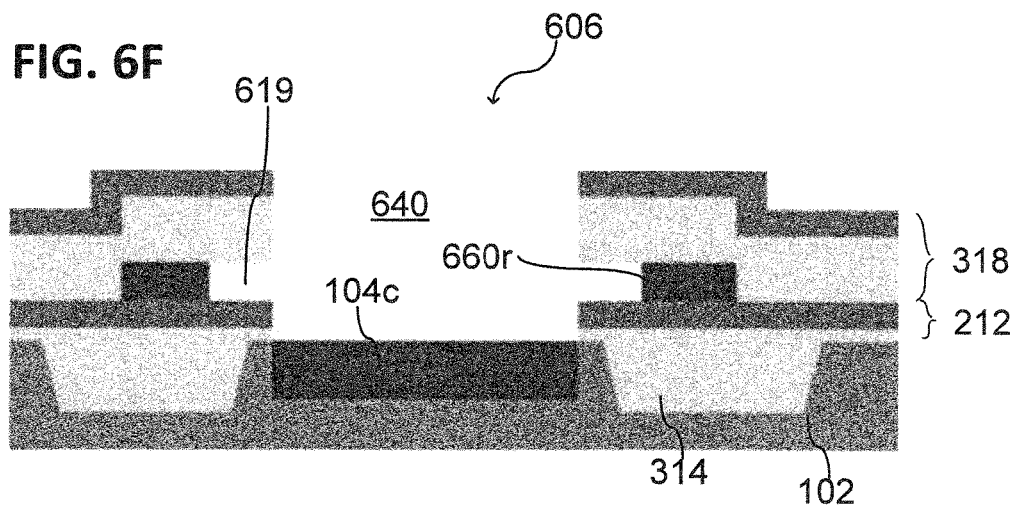

FIG. 6F illustrates the substrate 102 at a sixth processing stage 606, wherein the bottom oxide layer 312a of the first dielectric layer structure 212 may be opened by means of selective etching. According to various embodiments, the bottom oxide layer 312a of the first dielectric layer structure 212 may be partially removed (opened) such that the collector region 104c is exposed to deposit the base region 104b via the emitter window 640 (base window) on the collector region 104c. In case the first dielectric layer structure 212 may include a single dielectric layer, the first dielectric layer structure 212 may be partially removed (opened) at this processing stage such that the collector region 104c is exposed to deposit the base region 104b via the emitter window 640 (base window) on the collector region 104c.

Figure 6G:
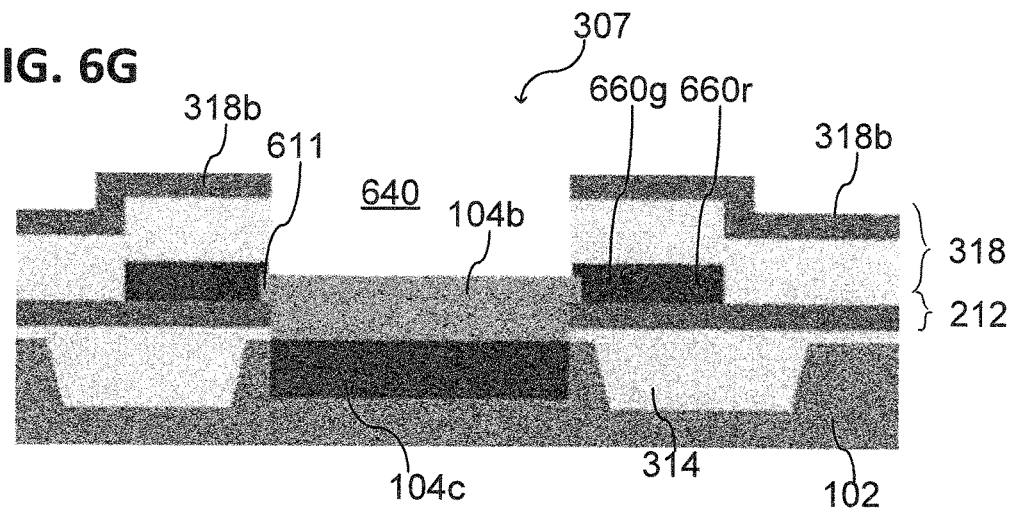

FIG. 6G illustrates the substrate 102 at a seventh processing stage 607, wherein the base (the base region 104b) may be deposited by means of selective epitaxial growth (SEG). The deposited base 104b may include silicon or a silicon/germanium compound.

The growth of the silicon starting from the collector region 104c will be epitaxial since it will initiate at a surface of single crystal silicon of the substrate 102. The silicon growing epitaxially may provide the base region 104b of the bipolar transistor structure 100. The growth of the silicon starting from the pre-structured polysilicon layer 660r in turn will be polycrystalline (not ordered) since no single crystal surface is provided to initiate an epitaxial growth. According to various embodiments, the pullback distance 615 may be provided in such a way, that the single crystalline and poly crystalline fronts 611 meet each other behind the top corner of the etched cavity 619 (see e.g. FIG. 6F). Alternatively, the pullback distance 615 may be provided in such a way, that the polycrystalline silicon will not meet the collector region 104c. Therefore, according to various embodiments, a propagation of stacking faults and/or crystal defects into the active area of the transistor 104 or in the base-collector junction 104b, 104c of the BJT 104 or HBT 104 of the bipolar transistor structure 100 may be reduced or even prevented. Illustratively, the pullback of the polysilicon layer 660 may provide space for the silicon to not grow into the base region 104b from the polysilicon layer 660 during the base region 104b is deposited. According to various embodiments, the pullback distance 615 may be in the range from about 5 nm to about 200 nm.

According to various embodiments, the etched cavity 619 between the first dielectric layer structure 212 and the second dielectric layer structure 318 may be filled again during the growth of the base region 104b with polysilicon 660g. The refilled polysilicon 660g and the pre-structured polysilicon layer 660r may together provide the polysilicon base terminal 106 of the bipolar transistor structure 100. According to various embodiments, after the base terminal 660g, 660r has been deposited, the base terminal 660g, 660r and the base region 104b may be linked (e.g. electrically connected) via performing an anneal.

Figure 6H:
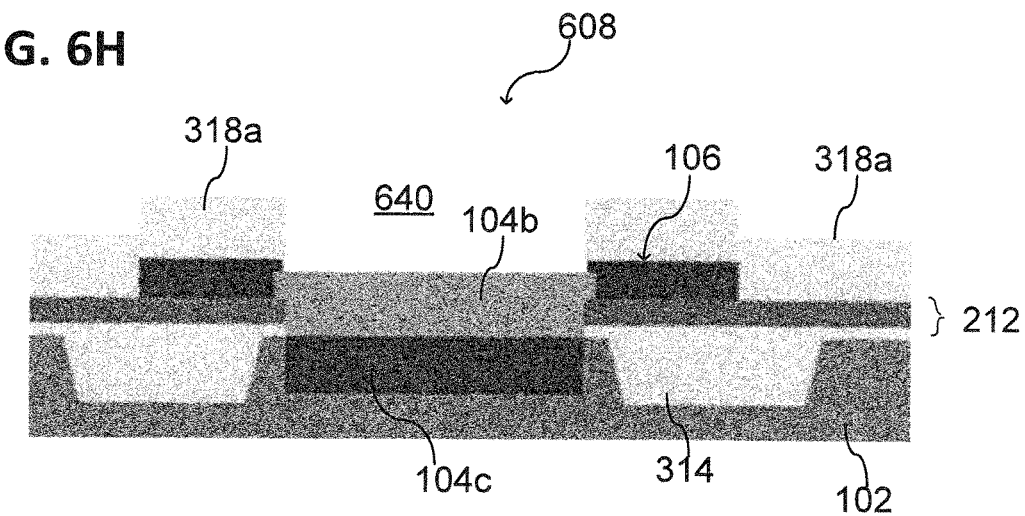

FIG. 6H illustrates the substrate 102 at an eight processing stage 608, wherein the nitride cap 318b of the second dielectric layer structure 318 may be removed (stripped), e.g. by means of selective wet etching.

Figure 6I:
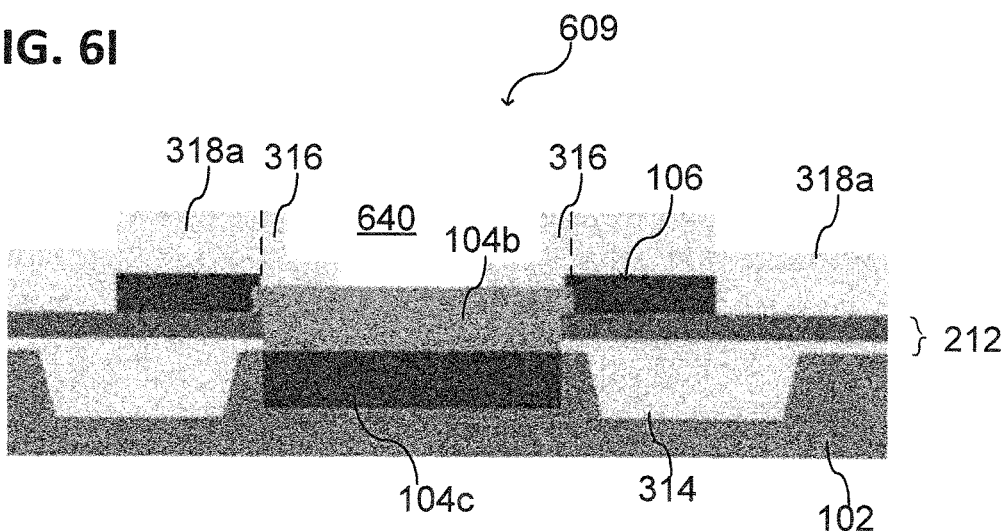

FIG. 6I illustrates the substrate 102 at a ninth processing stage 609, wherein an optional L-spacer 316 is formed for (e.g. laterally) shrinking of the emitter window 640. According to various embodiments, forming the L-spacer 316 may include applying industry standard process flows for spacer processing, e.g. a successive deposition of oxide and nitride films followed by selective anisotropic dry etching.

Figure 6J:
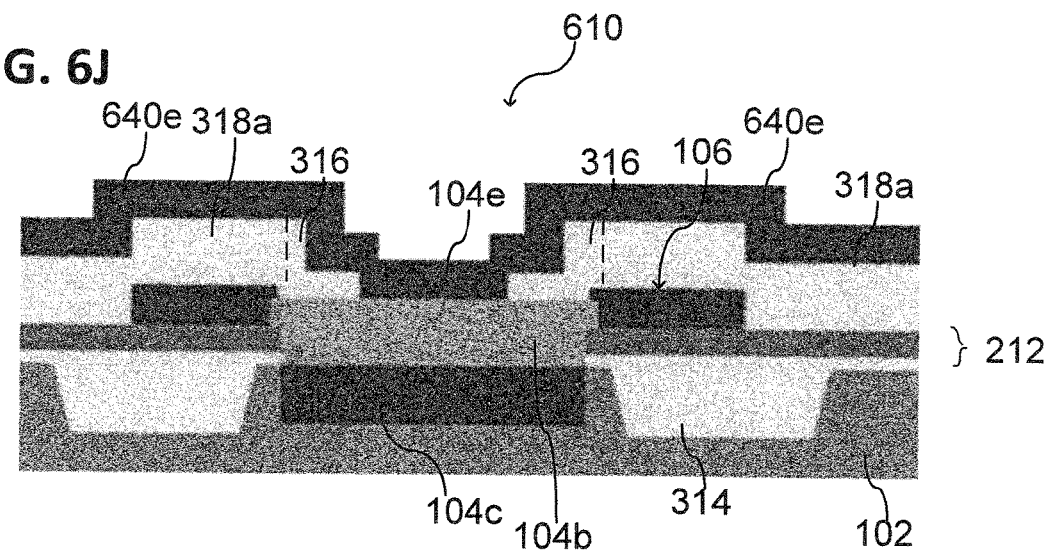

FIG. 6J illustrates the substrate 102 at a tenth processing stage 610, after a deposition has been performed to provide an emitter layer 640e, e.g. via epitaxial growth using CVD or PVD. According to various embodiments, the emitter region 104e may be provided via the emitter layer 640e being deposited over the silicon oxide layer 318a of the second dielectric layer structure 318 and over the base region 104b. According to various embodiments, at least the emitter region 104e of the emitter layer 640e may include single crystalline (epitaxially grown) silicon. According to various embodiments, as illustrated in FIG. 6J, the base terminal 106 may exclusively contact the base region 104b. The laterally contacting of the base region 104b via the emitter region 104e may allow a short wiring to the base region 104b and therefore a fast switching behavior of the BJT 104 or the HBT 104 of the bipolar transistor structure 100.

Figure 6K:
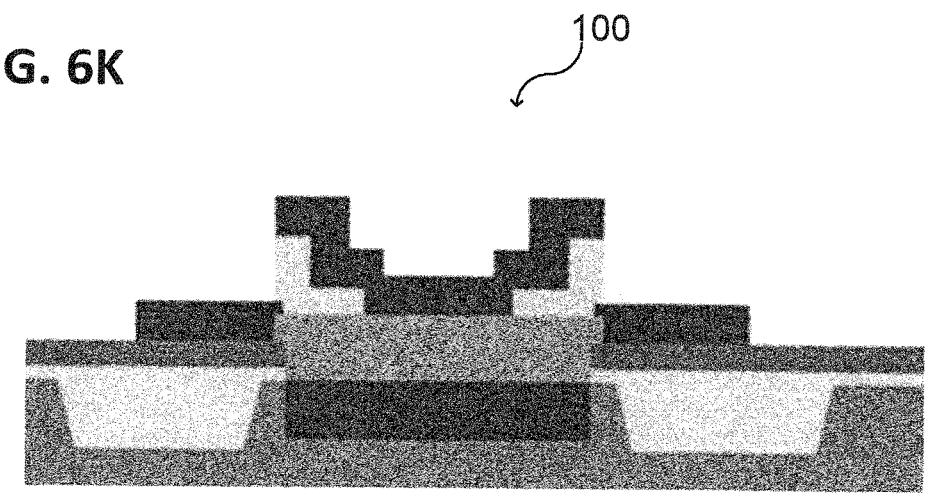

FIG. 6K illustrates the substrate 102 at a final processing stage, e.g. after the outer emitter layer 640e and the silicon oxide layer 318a of the second dielectric layer structure 318 are patterned by means of photo lithography and etching. According to various embodiments, the base terminal 106 may be exposed via partially removing the outer emitter layer 640e and the silicon oxide layer 318a of the second dielectric structure 318 to provide the bipolar transistor structure 100, as described herein.

According to various embodiments, the BJT 104 or the HBT 104 of the bipolar transistor structure 100, as illustrated in FIG. 6K, may be ready for further processing. According to various embodiments, the bipolar transistor structure 100 may be packaged after the manufacture.

According to various embodiments, a bipolar transistor structure may include: a substrate; a collector region in the substrate; a base region disposed over the collector region, an emitter region disposed over the base region; a base terminal laterally electrically contacting the base region, wherein the base terminal includes polysilicon.

According to various embodiments, the substrate may include a silicon wafer or a silicon die. According to various embodiments, the substrate may include single crystalline silicon.

According to various embodiments, the collector region and the emitter region may include silicon doped with a first doping type, and the base region may include silicon doped with a second doping type different from the first doping type. Further, according to various embodiments, the base terminal may include silicon doped with the second doping type.

According to various embodiments, the base region may include at least one material of the following group of materials, the group consisting of: epitaxially grown silicon; and an epitaxially grown silicon/germanium alloy.

According to various embodiments, the bipolar transistor structure may further include a (first) dielectric layer structure disposed between the substrate and the base terminal (base electrode).

According to various embodiments, the bipolar transistor structure may further include a dielectric isolation structure arranged in the substrate next to the collector region.

According to various embodiments, a method of manufacturing a bipolar transistor structure may include: forming a collector region in a substrate; forming a base region over the collector region, forming an emitter region over the base region; and forming a base terminal laterally electrically contacting the base region, wherein the base terminal includes polysilicon.

According to various embodiments, forming the base region may include epitaxially growing silicon from the collector region.

According to various embodiments, a method of manufacturing a bipolar transistor structure may include: covering a collector region in a substrate with a first dielectric layer structure; forming a polysilicon layer over the first dielectric layer structure; forming a second dielectric layer structure over the polysilicon layer, the second dielectric layer structure covering the polysilicon layer; partially removing the second dielectric layer structure and the polysilicon layer to partially expose the first dielectric layer structure over the collector region and to expose a lateral side of the polysilicon layer; removing a portion of the polysilicon layer from the exposed lateral side of the polysilicon layer; removing the exposed first dielectric layer structure to at least partially expose the collector region; and growing epitaxial silicon over the collector region to form a base region, the epitaxially grown base region connecting to the polysilicon layer.

According to various embodiments, growing epitaxial silicon over the collector region may include laterally growing polysilicon from the polysilicon layer (from the pre-structured polysilicon layer) simultaneously.

According to various embodiments, the method of manufacturing a bipolar transistor structure may further include: forming an emitter layer over the epitaxially grown base region. According to various embodiments, the method of manufacturing a bipolar transistor structure may further include: forming an emitter layer over the epitaxially grown base region and patterning the emitter layer to provide an emitter region. According to various embodiments, the method of manufacturing a bipolar transistor structure may further include: forming a sidewall spacer at the second dielectric layer structure over the epitaxially grown base region before the emitter layer is formed.

According to various embodiments, covering the collector region may include: forming a first silicon oxide layer over the substrate; and forming a first silicon nitride layer over the first silicon oxide layer. According to various embodiments, covering the collector region may include forming a first dielectric layer structure.

According to various embodiments, forming the second dielectric layer structure may include: forming a second silicon oxide layer over the substrate; and forming a second silicon nitride layer over the second silicon oxide layer.

According to various embodiments, the method of manufacturing a bipolar transistor structure may further include: patterning the emitter layer and the second dielectric layer structure to at least partially expose the polysilicon layer to provide an exposed base terminal electrically contacting the base region.

According to various embodiments, the method of manufacturing a bipolar transistor structure may further include: performing an ion implantation after partially removing the second dielectric layer structure and the polysilicon layer to dope the collector region in the substrate.

According to various embodiments, the method of manufacturing a bipolar transistor structure may further include: forming two dielectric regions in the substrate next to the collector region before the collector region is covered with the first dielectric layer structure.

According to various embodiments, the method of manufacturing a bipolar transistor structure may further include: performing an anneal to electrically link the base region and the polysilicon layer.

According to various embodiments, the method of manufacturing a bipolar transistor structure may further include: forming a collector terminal in the substrate electrically contacting the collector region.

According to various embodiments, a method of manufacturing a bipolar transistor structure may include: forming a layer structure over a collector region in a substrate, the layer structure including a first dielectric layer and a second dielectric layer and a polysilicon layer between the first dielectric layer and the second dielectric layer, etching a processing window into the layer structure, partially removing the polysilicon layer to laterally enlarge the processing window, and performing a layering process to fill the processing window with epitaxially grown silicon (or SiGe) connecting to the polysilicon layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of manufacturing a bipolar transistor structure, the method comprising:
   covering a collector region in a substrate with a first dielectric layer structure;
   forming a polysilicon layer over the first dielectric layer structure;
   forming a second dielectric layer structure over the polysilicon layer, the second dielectric layer structure covering the polysilicon layer;
   partially removing the second dielectric layer structure and the polysilicon layer to partially expose the first dielectric layer structure over the collector region and to expose a lateral side of the polysilicon layer;
   removing a portion of the polysilicon layer from the exposed lateral side of the polysilicon layer;
   removing the exposed first dielectric layer structure to at least partially expose the collector region; and
   growing epitaxial silicon over the collector region to form a base region, the epitaxially grown base region connecting to the polysilicon layer.

2. The method of claim 1,
   wherein growing epitaxial silicon comprises laterally growing polysilicon from the polysilicon layer simultaneously.

3. The method of claim 1, further comprising:
   forming an emitter layer over the epitaxially grown base region.

4. The method of claim 3, further comprising:
   forming a sidewall spacer at the second dielectric layer structure over the epitaxially grown base region before the emitter layer is formed.

5. The method of claim 1,
   wherein covering the collector region comprises:
   forming a first silicon oxide layer over the substrate; and
   forming a first silicon nitride layer over the first silicon oxide layer.

6. The method of claim 1,
   wherein forming the second dielectric layer structure comprises:
   forming a second silicon oxide layer over the substrate; and
   forming a second silicon nitride layer over the second silicon oxide layer.

7. The method of claim 3, further comprising:
   patterning the emitter layer and the second dielectric layer structure to at least partially expose the polysilicon layer to provide an exposed base terminal electrically contacting the base region.

8. The method of claim 1, further comprising:
   performing an ion implantation after partially removing the second dielectric layer structure and the polysilicon layer to provide a doped collector region.

9. The method of claim 1, further comprising:
   forming two dielectric regions in the substrate next to the collector region before the collector region is covered with the first dielectric layer structure.

10. The method of claim 1, further comprising:
    performing an anneal to electrically link the base region and the polysilicon layer.

11. The method of claim 1, further comprising:
    forming a collector terminal in the substrate electrically contacting the collector region.

12. A method of manufacturing a bipolar transistor structure, the method comprising:
    forming a collector region in a substrate;
    forming a base region over the collector region,
    forming an emitter region over the base region;
    forming a base terminal laterally electrically contacting the base region, wherein the base terminal comprises polysilicon; and
    forming a dielectric layer structure between the substrate and the base terminal so that substantially all of a surface of the base terminal facing the substrate is disposed on the dielectric layer structure.

13. The method of claim 12,
    wherein forming the base region comprises epitaxially growing silicon from the collector region.

14. The method of claim 12,
    wherein the substrate comprises silicon.

15. The method of claim 12,
    wherein the collector region and the emitter region are formed of silicon doped with a first doping type, and
    wherein the base region is formed of silicon doped with a second doping type different from the first doping type.

16. The method of claim 15,
    wherein the base terminal is formed of silicon doped with the second doping type.

17. The method of claim 12,
    wherein the base region comprises at least one material of the following group of materials, the group consisting of:
    epitaxially grown silicon; and
    an epitaxially grown silicon/germanium alloy.

18. The method of claim 12, further comprising:
    forming a dielectric isolation structure in the substrate next to the collector region.

* * * * *